US006323082B1

United States Patent
Furukawa et al.

(10) Patent No.: US 6,323,082 B1
(45) Date of Patent: Nov. 27, 2001

(54) PROCESS FOR MAKING A DRAM CELL WITH THREE-SIDED GATE TRANSFER

(75) Inventors: Toshiharu Furukawa; David V. Horak, both of Essex Junction; Steven J. Holmes; Mark C. Hakey, both of Milton, all of VT (US); Jack A. Mandelman, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/565,504

(22) Filed: May 5, 2000

Related U.S. Application Data

(62) Division of application No. 09/126,412, filed on Jul. 30, 1998, now Pat. No. 6,121,651.

(51) Int. Cl.$^7$ .............................................. H01L 21/8242

(52) U.S. Cl. .................. 438/247; 438/249; 438/296; 438/129; 438/947

(58) Field of Search .................................. 438/947, 247, 438/249, 296, 129, FOR 212, FOR 189

(56) References Cited

U.S. PATENT DOCUMENTS

| | | | |
|---|---|---|---|
| 4,449,285 | 5/1984 | Janes et al. | 29/571 |
| 4,606,011 | 8/1986 | Wada et al. | 365/149 |
| 4,670,768 | 6/1987 | Sunami et al. | 357/42 |

(List continued on next page.)

FOREIGN PATENT DOCUMENTS

| | | | |
|---|---|---|---|
| 404177761 | 6/1992 | (JP) | 257/296 |
| 404162665 | 8/1992 | (JP) | 257/296 |
| 404242970 | 8/1992 | (JP) | 257/296 |

OTHER PUBLICATIONS

G. Bronner et al., A Fully Planarized 0.25 ⌐m CMOS Technology for 256Mbit DRAM and Beyond, 1995 Symposium on VLSI Technology Digest of Technical Papers, 15–16 (1995).

L. Nesbit et al., A 0.6⌐m$^2$ 256 Mb Trench DRAM Cell With Self–Aligned BuriEd STrap (BEST), IEDM, 627–30 (1993).

D. Kenney et al., 16–Mbit Merged Isolation and Node Trench SPT Cell (MINT), 1988 Symposium on VLSI Technology Digest of Technical Papers, 25–26 (1988).

J.A. Mandelman et al., Body–Doping Considerations for High Performance 0.1 ⌐m SOI MOSFETS, 1991 IEEE International SOI Conference Proceedings, 54–55 (1991).

K. Hieda et al., Effects of a New Trench–Isolated Transistor Using Sidewall Gates, IEEE Transactions on Electron Devices, vol. 36 (9), 1615–19, 1989.

K. Shibahara et al., 1G DRAM Cell with Diagonal Bit–Line (DBL) Configuration and Edge Operation MOS (EOS) FET, IEDM, 639–42 (1994).

(List continued on next page.)

Primary Examiner—George Fourson
Assistant Examiner—Thanh V Pham
(74) Attorney, Agent, or Firm—Ratner & Prestia; William D. Sabo, Esq.

(57) ABSTRACT

A DRAM device and a process of manufacturing the device. The DRAM device includes a bit-line coupled to a signal storage node through a transfer device that is controlled by a word line. The transfer device includes a mesa structure having a first end, a second end opposite the first end, a top, a first side, and a second side opposite the first side. A bit-line diffusion region couples the first end of the mesa structure to a bit-line contact. A storage node diffusion region couples the second end of the mesa structure to the signal storage node. The word line controls a channel formed in the mesa structure through a gate which is formed upon the first side, the second side, and the top of the mesa structure. A sub-minimum width of the mesa structure allows full depletion to be easily achieved, resulting in volume inversion in the channel.

17 Claims, 13 Drawing Sheets

U.S. PATENT DOCUMENTS

| | | | |
|---|---|---|---|
| 4,685,196 | 8/1987 | Lee | 437/41 |
| 4,801,988 * | 1/1989 | Kenney | 357/23.6 |
| 4,833,516 | 5/1989 | Hwang et al. | 357/23.6 |
| 4,910,567 | 3/1990 | Malhi | 357/23.6 |
| 5,013,679 | 5/1991 | Kumagai et al. | 437/52 |
| 5,173,439 * | 12/1992 | Dash et al. | 437/67 |
| 5,264,716 * | 11/1993 | Kenney | 257/301 |
| 5,289,027 | 2/1994 | Terrill et al. | 257/327 |
| 5,348,905 | 9/1994 | Kenney | 437/52 |
| 5,360,758 | 11/1994 | Bronner et al. | 437/52 |
| 5,404,037 | 4/1995 | Manley | 257/321 |
| 5,567,962 | 10/1996 | Miyawaki et al. | 257/296 |
| 5,675,164 * | 10/1997 | Brunner et al. | 257/331 |
| 5,909,044 * | 6/1999 | Chakravarti et al. | 257/301 |
| 5,990,510 | 11/1999 | Choi et al. | 257/296 |
| 5,994,197 | 11/1999 | Liao | 257/396 |
| 5,994,729 | 11/1999 | Cho | 257/300 |
| 5,998,820 | 12/1999 | Chi | 257/296 |
| 5,998,821 | 12/1999 | Hieda et al. | 257/301 |
| 6,008,513 | 12/1999 | Chen | 257/296 |
| 6,020,609 | 2/2000 | Wu | 257/309 |
| 6,025,620 | 2/2000 | Kimura et al. | 257/296 |
| 6,037,210 * | 3/2000 | Leas | 438/245 |

OTHER PUBLICATIONS

H. Ishiuchi et al., Embedded DRAM Technologies, IDEM Technical Digest, 33–6 (1997).

T. Eimori et al., A Newly Designed Planar Stacked Capacitor Cell with High Dielectric Constant Film for 2 256Mbit DRAM, IEDM, 631–4 (1993).

* cited by examiner

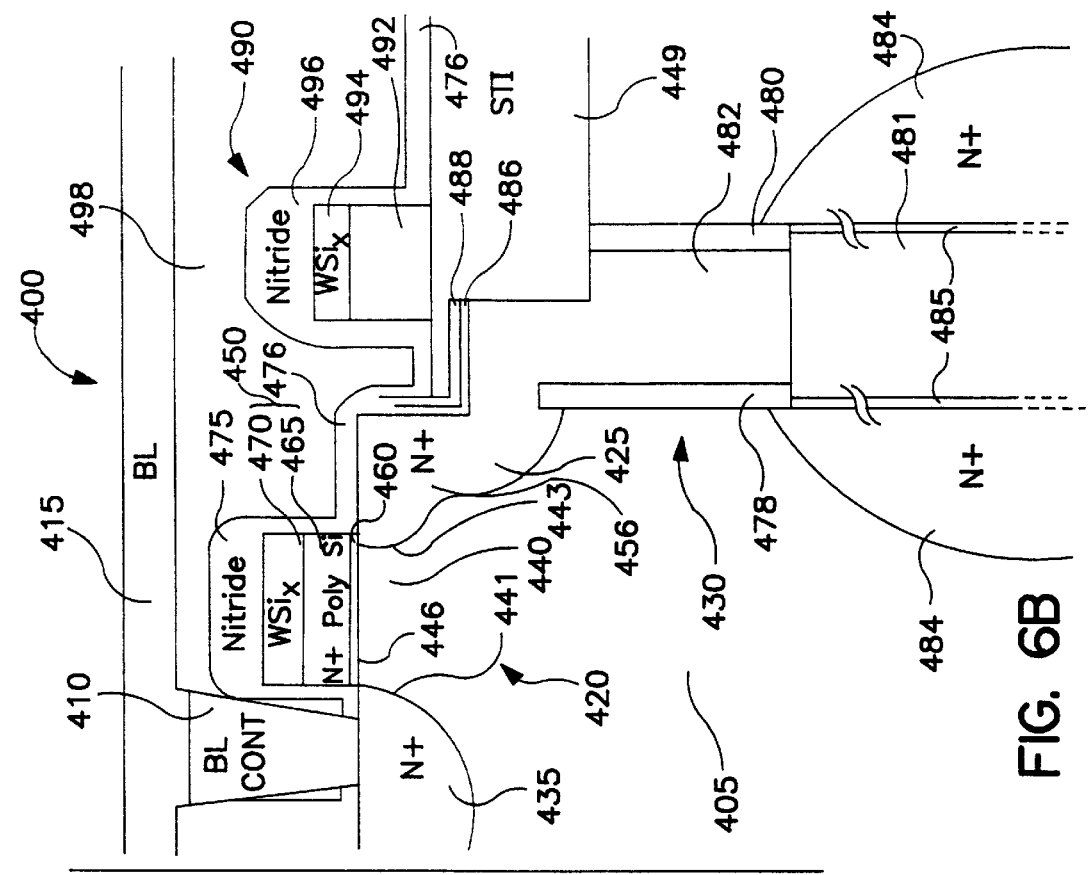
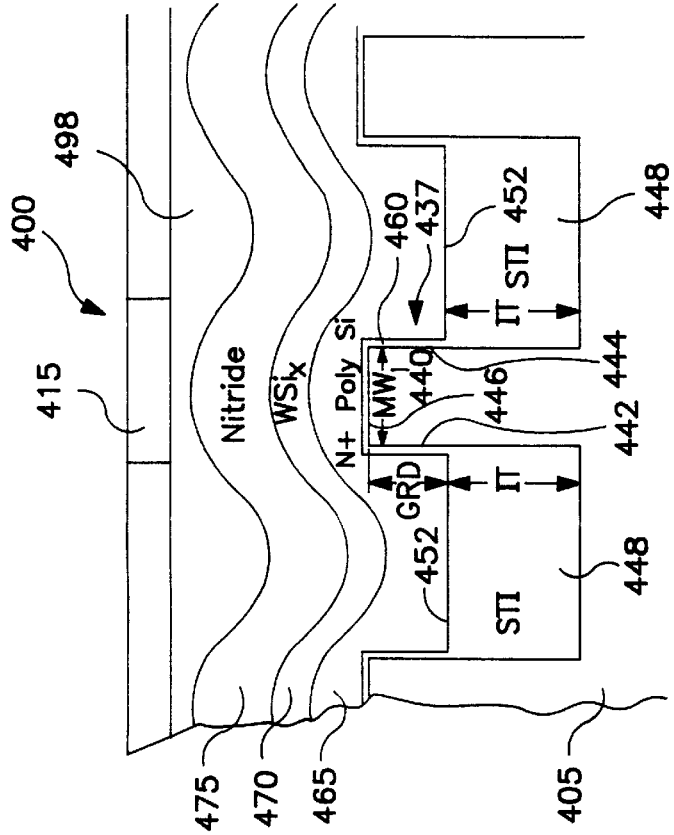
FIG. 6B
FIG. 6A

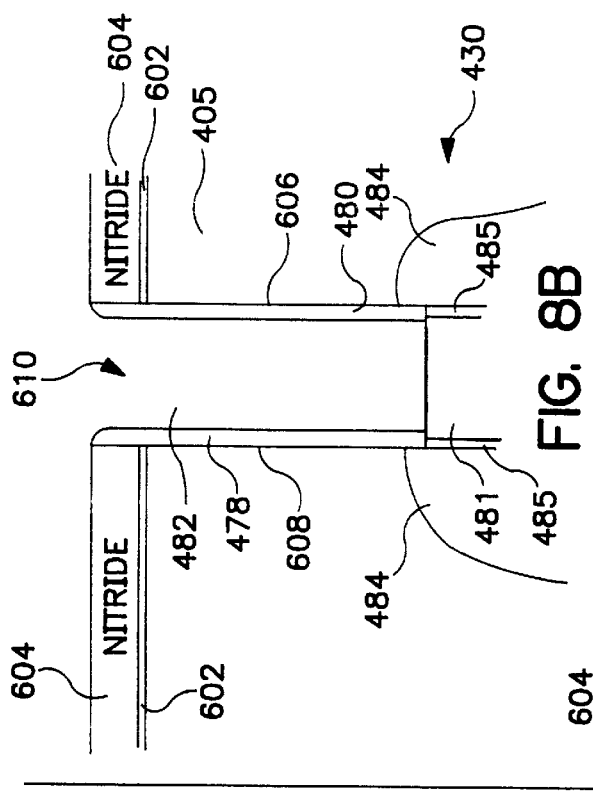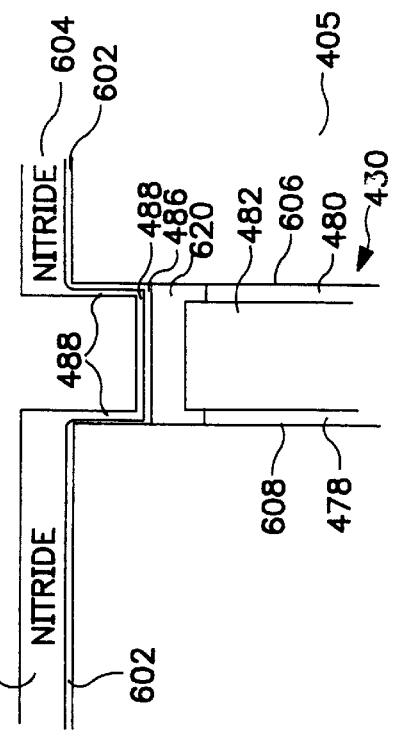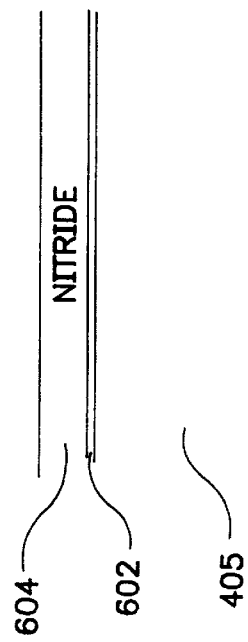

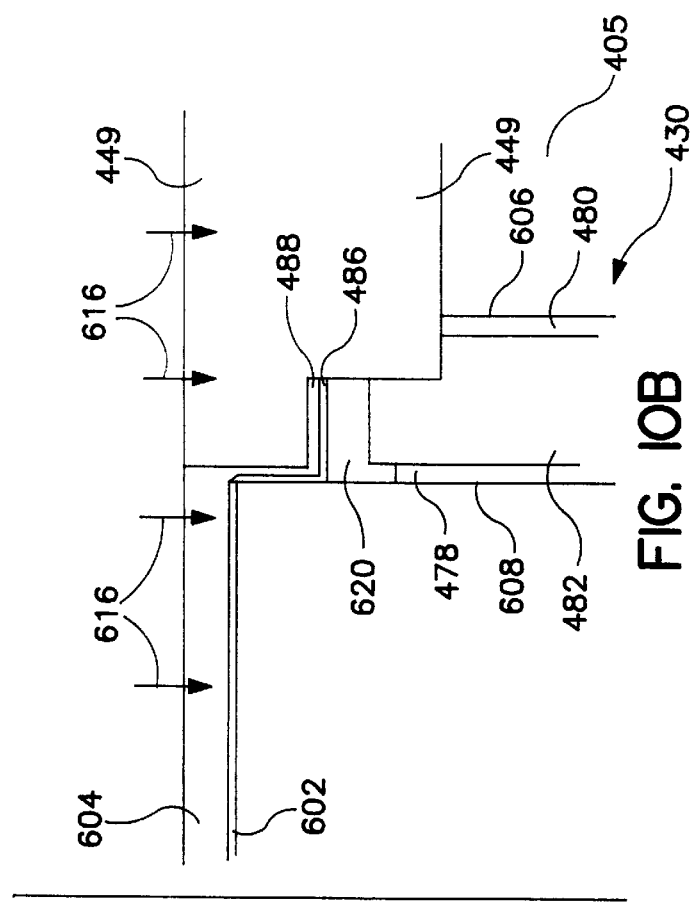
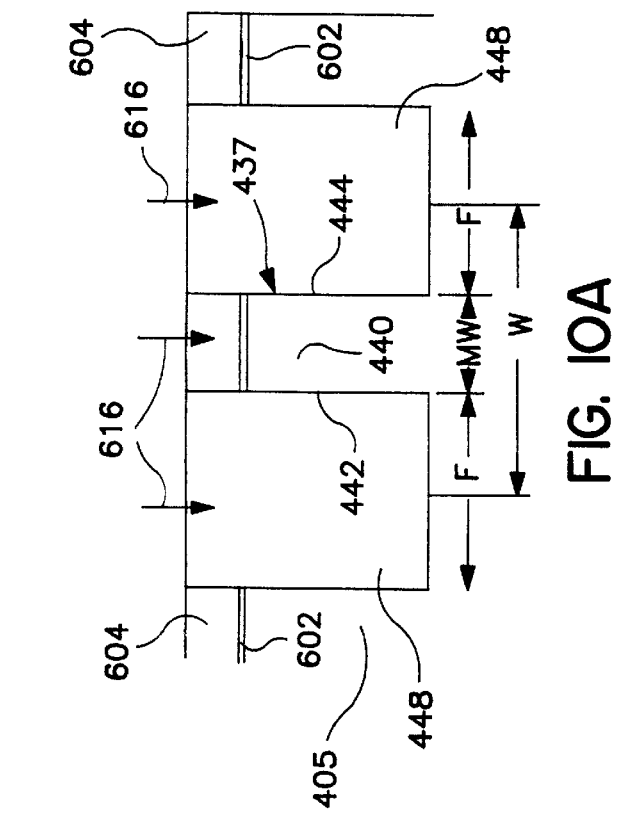

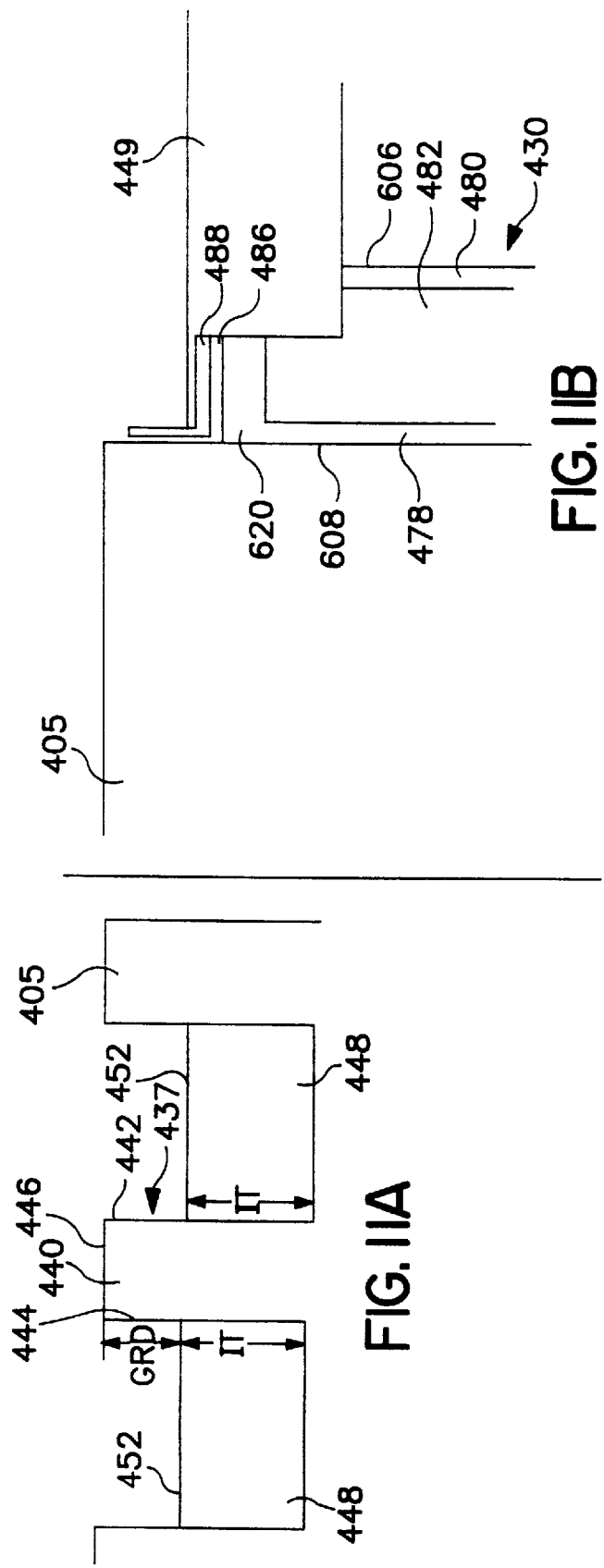

PROCESS FOR MAKING A DRAM CELL WITH THREE-SIDED GATE TRANSFER

This application is a divisional of U.S. patent application Ser. No. 09/126,412, filed on Jul. 30, 1998, now issued as U.S. Pat. No. 6,121,651.

FIELD OF THE INVENTION

This invention relates generally to a semiconductor device and a process of manufacturing a semiconductor device. More specifically, this invention relates to a dynamic random access memory (DRAM) semiconductor device having a three-sided-gate transfer device and a process for manufacturing the same.

BACKGROUND OF THE INVENTION

In the semiconductor industry, there is an incentive to reduce the size of each semiconductor device on a chip. A smaller device can allow an increased density of devices on a chip and can help semiconductor manufacturers reduce cost and improve performance of a chip. When the size of a DRAM device or cell is reduced, more DRAM cells can fit on a chip of a certain size, resulting in increased memory storage capability of the chip.

The size of a DRAM device may be reduced by designing the DRAM device or cell in three-dimensions. This may reduce the semiconductor surface area used by each DRAM cell. For example, using trench capacitors in a DRAM cell may result in a reduced semiconductor surface area used by the DRAM cell. FIG. 1 shows a cross section of a buried plate trench DRAM cell 100 as described by Donald M. Kenney in U.S. Pat. No. 5,348,905.

The DRAM cell 100 in FIG. 1 is formed in a p-type semiconductor substrate 10. A p-type well 12 is formed in the upper surface of the substrate 10. An n-channel transfer device 14 is formed within the p-type well 12. The transfer device 14 couples data between a bit-line (not shown) that is connected to the bit-line diffused n-type region 18 and the diffused n-type storage node region 20. The gate electrode 16 is connected to a word line (not shown) and controls the transfer of data through the channel 34 of the transfer device 14.

A storage capacitor is formed in a deep trench 22 adjacent diffused n-type storage node region 20. The storage capacitor includes a signal storage node 24 in the deep trench 22 which is isolated from substrate 10 by a thin dielectric layer (not shown). The diffused n-type storage node region 20 and the signal storage node 24 in the deep trench 22 are connected by a conductive strap 26. An insulating collar 28 decreases leakage of stored charge between diffused n-type storage node region 20 and buried n-type layer 32. The surface region of substrate 10 occupied by the DRAM cell 100 is defined by local surface isolation 30.

The buried n-type layer 32 acts as the reference voltage node for the trench capacitor and forms electrical and physical isolation between the p-type well 12 and the substrate 10. As known to those skilled in the art, reference voltages $V_{bn}$, $V_{bp}$, and $V_{sub}$ may be used to bias the device 100.

FIGS. 2A–2D illustrate a three-sided gated DRAM cell in a diagonal bit-line configuration. K. Shibahara et al., *1GDRAM Cell With Diagonal Bit-Line (DBT) Configuration and Edge Operation MOS(EOS) FET*, IEDM Technical Digest, 639–42 (1994). As shown in FIGS. 2A and 2B, the device 200 is formed in a substrate 202. The device 200 has a channel 206 coated with a gate oxide 208 and a gate conductor 204. The storage node of the device 200 is a stacked capacitor. Id. at 640.

FIG. 2B shows the device 200 in operation where an inversion layer 210 is formed at a corner 212 of the channel 206. FIG. 2C shows the layout of a device 200, defined by a boundary 216, that occupies a $6F^2$ (3F×2F) size area of the substrate 202, where F is the minimum lithographic dimension. As shown in FIG. 2C, the device 200 does not have any sub-lithographic dimensions.

Recessed LOCOS (local isolation of silicon) isolation regions are used to isolate the device 200 rather than using shallow trench isolation (STI) regions. Id. at 640 (see first paragraph). As shown in FIG. 2D, the LOCOS isolation regions form a birds beak 214 which may result in enough mechanical stress to cause dislocations of the silicon lattice and cause silicon defects.

FIG. 3 illustrates a MOSFET (metal oxide semiconductor field effect transistor) device 300 gated on three sides. K. Hieda et al., *Effects of a New Trench-Isolated Transistor Using Sidewall Gates*, IEEE Transactions on Electron Devices, Vol. 36(9), 1615–19 (1989). The device 300 formed in a substrate 302 includes a drain 304, a source 306, and a three-sided gate 308. Isolation regions 310 are formed on both sides of the device 300. Each isolation region 310 is formed in a trench coated with an oxide layer 312 and then filled with polysilicon 314.

By using a three-sided gate 308, sidewall conduction of the channel 316 may be achieved. K. Hieda et al. teach that the above MOSFET device 300 is compatible with isolation merged DRAM and folded capacitor cells (see page 1616, column 2, first full paragraph) also known as stacked-in-trench cells. The device 300 is formed without a channel tailor implant on the sidewalls of the channel 316 (see page 1616, column 1, last paragraph).

To overcome the shortcomings of conventional DRAM devices, a new DRAM device is provided. An object of the present invention is to provide an improved DRAM device that has a reduced leakage current. A related object is to provide a process of manufacturing such a DRAM device. Another object is to provide a DRAM device that occupies a reduced semiconductor area. Another object is to provide a DRAM device having a sub-lithographic channel width on a substantially planar substrate surface. It is still another object to provide a DRAM device having a transfer device with a channel controlled from three sides. Yet another object is to provide a DRAM device having improved charge characteristics.

SUMMARY OF THE INVENTION

To achieve these and other objects, and in view of its purposes, the present invention provides a DRAM device having reduced leakage current and a process of manufacturing the DRAM device. The DRAM device includes a signal storage node. A transfer device couples a bit-line contact to the signal storage node. The transfer device includes a mesa structure having a first end, a second end opposite the first end, a top, a first side, and a second side opposite the first side. A bit-line diffusion region couples the first end of the mesa structure to the bit-line contact. A storage node diffusion region couples the second end of the mesa structure to the signal storage node. The mesa structure is controlled by a gate which is formed upon the first side, the second side, and the top of the mesa structure.

It is to be understood that both the foregoing general description and the following detailed description are exemplary, but are not restrictive, of the invention.

BRIEF DESCRIPTION OF THE DRAWINGS

The invention is best understood from the following detailed description when read in connection with the accompanying drawing. It is emphasized that, according to common practice, the various features of the drawing are not to scale. On the contrary, the dimensions of the clarity. Included in the drawing are the following figures:

FIGS. 6A and 6B are cross sectional views of a DRAM cell according to the present invention;

FIGS. 8A, 8B through 13A, 13B are sectional views of a DRAM cell illustrating a process of manufacturing the cell according to an exemplary embodiment of the present invention;

DETAILED DESCRIPTION OF THE INVENTION

Device

Figure 4:
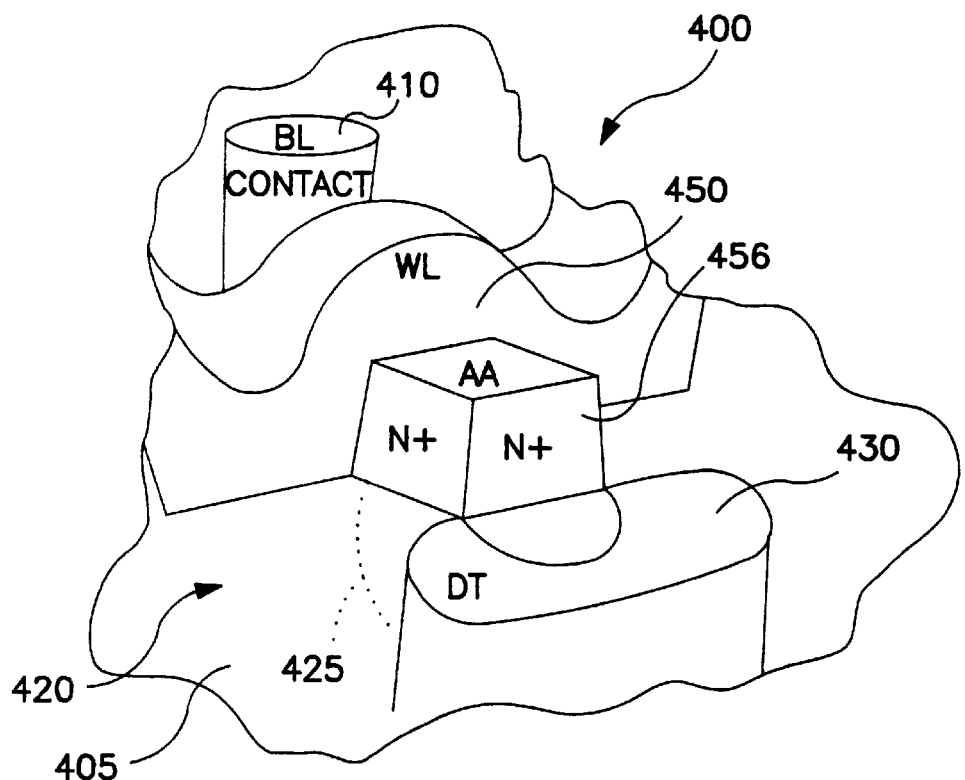
FIG. 4 is a partial three-dimensional view of a DRAM cell according to the present invention.

Referring now to the drawing, wherein like reference numerals refer to like elements throughout, FIG. 4 shows a partial three-dimensional view of a DRAM cell 400 according to the present invention. The DRAM cell 400 is formed in a substrate 405. A bit-line contact 410 (BL contact) is coupled to a signal storage node 430 (DT for deep trench as in an exemplary embodiment) through the transfer device 420.

Figure 5:
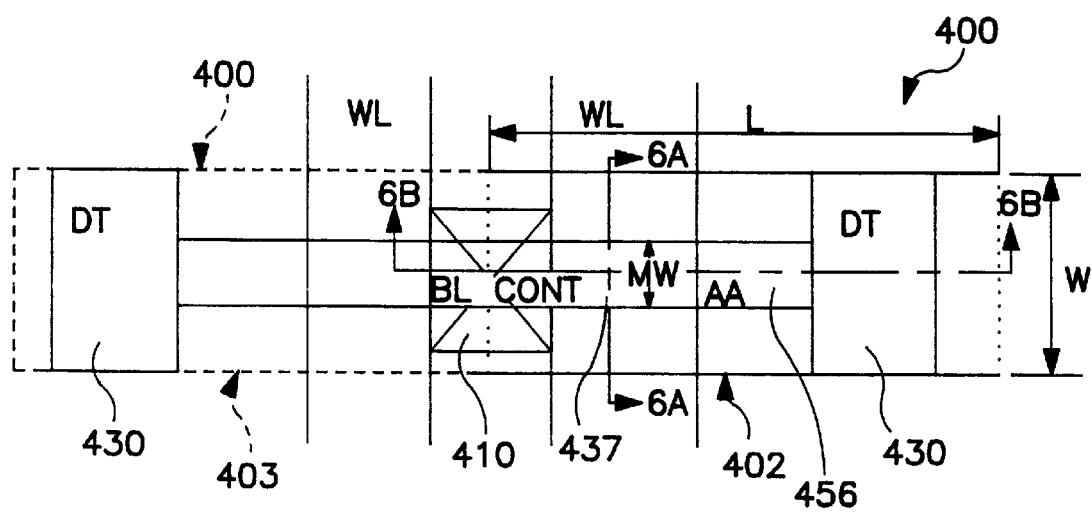
FIG. 5 is a top view of an exemplary DRAM cell according to the present invention.

The transfer device 420 includes a mesa 437 shown in FIGS. 5 and 6A. A channel 440 (FIG. 6A) may be formed within the mesa 437 and controlled by the word line 450 (WL). The channel 440 is coupled to the bit-line contact 410 by a bit-line diffusion region 435 (FIG. 6B). The channel 440 is coupled to the signal storage node 430 by the storage node diffusion region 456 (AA for active area) and a conductive strap. In an exemplary embodiment, the storage node diffusion region 456 is coupled to the signal storage node 430 by a buried strap 425 as shown in FIG. 4.

FIG. 5 shows a top view of a DRAM cell 400 according to the present invention. The boundaries 402, 403 show the surface area of the substrate 405 occupied by two DRAM cells 400 that share a bit-line contact 410 (BL CONT). The length of the DRAM cell 400 is represented by "L" and the width of the DRAM cell is represented by "W". In an exemplary embodiment, where F is the minimum lithographic dimension and the mesa 437 has a mesa width MW=0.5F, then L=4.0F, W=1.5F, and the DRAM cell 400 occupies a substrate 405 surface area of $6.0F^2$. Preferably, a DRAM cell 400 according to the present invention will occupy a surface area of the substrate 405 less than or equal to $6.0F^2$.

FIGS. 6A and 6B show sectional views of a DRAM cell according to the present invention taken along lines 6A—6A and 6B—6B, respectively, of FIG. 5. The bit-line metallization 415 is connected to the bit-line contact 410. The transfer device 420 couples the bit-line contact 410 to the signal storage node 430.

The transfer device 420 includes a bit-line diffusion region 435, a mesa 437, and a storage node diffusion region 456. The bit-line contact 410 is formed upon and coupled to the bit-line diffusion region 435. The mesa 437 has a first end 441 adjacent the bit-line diffusion region 435 and a second end 443 opposite the first end and adjacent the storage node diffusion region 456. In a preferred embodiment, the storage node diffusion region 456 is coupled to the signal storage node 430 by a buried strap 425 as shown in FIG. 6B.

The mesa 437 has a top 446, a first side 442, and a second side 444 opposite the first side 442. The mesa width MW is the distance from the first side 442 to the second side 444 of the mesa 437. Preferably the mesa width MW is of a sub-lithographic dimension. In an exemplary embodiment, where F is the minimum lithographic dimension, the mesa width MW=0.5F.

The DRAM cell 400 is insulated from adjacent cells on a substrate 405 by isolation regions 448, 449. The isolation regions 448 also define the mesa 437. The isolation regions 448 adjacent the mesa 437 have a top surface 452. The distance from the top surface 452 of the isolation regions 448 to the top 446 of the mesa 437 is the gate recess depth (GRD). Preferably, the gate recess depth GRD is greater than half the mesa width MW. The thickness of the isolation regions 448 is IT as shown in FIG. 6A. Preferably, the top surface 452 of the isolation regions 448 are substantially planar. In an exemplary embodiment, a substantially planar top surface 452 results in isolation region thickness IT variations less than ±5.0%.

The height of the mesa formed by the sides 442, 444 and the isolation regions 448 is the sum of the gate recess depth GRD and the isolation thickness IT (GRD+IT). Preferably, as shown in FIG. 6A, the first side 442 and the second side 444 of the mesa 437 are substantially planar. In an exemplary embodiment, the bow of the sidewalls of the mesa is less than the smaller of 5.0% of the mesa height (GRD+IT) and 10 nm.

The gate recess depth GRD and the mesa 437 doping concentration are chosen to provide desired DRAM cell 400 characteristics. For example, as the gate recess depth GRD decreases, the mesa 437 doping concentration may need to be decreased to achieve fully depleted operation. This results in a lower threshold voltage $V_{th}$ and poorer DRAM device 400 turn off characteristics. The aspect ratio (GRD:MW) of the mesa 437 is chosen to achieve a desired degree of depletion in consideration of the mesa width MW, mesa 437 doping concentration, dielectric layer 460 thickness, and the desired device 400 electric operating point.

In a preferred embodiment, the isolation regions 448 are shallow trench isolation (STI) regions. Using STI isolation regions 448 results in a DRAM cell 400 exhibiting less stress than a DRAM cell having an isolation region thermally grown by LOCOS (local oxidation of silicon), for example. The mechanical stress in a DRAM cell caused by a volume expansion of a thermally grown silicon dioxide isolation region may result in silicon defects by causing dislocations of the silicon lattice. Silicon defects may increase junction leakage and reduce data retention time.

The transfer device 420 is controlled by a gate formed upon the first side 442, the second side 444, and the top 446 of the mesa 437. The gate is used to control the formation of the channel 440 in the mesa 437. The gate of the transfer device 420 includes a dielectric layer 460 and is wired by the word line 450 including a wiring conductor 470 over a conductor 465 such as a doped polysilicon layer. Preferably, the dielectric layer 460 has a substantially uniform thickness along the sides 442, 444 and top 446 of the mesa 437. In an exemplary embodiment, the dielectric layer 460 thickness varies less than ±5.0%. A substantially uniform thickness of the dielectric layer improves desired device electrical characteristics consistent with dielectric reliability. Preferably, the material of conductor 470 is $WSi_x$ or W. The DRAM device 400 further includes a nitride layer 475 formed upon the conductor material 470.

In a preferred embodiment, the signal storage node 430 is a capacitor having a capacitance greater than about 20 femto Farads. In an exemplary embodiment, the signal storage node 430 is a deep trench type storage node as shown in FIG. 6B. The signal storage node 430 comprises a buried n+ plate 484; collar oxide 478, 480; a signal storage node dielectric 485; a first n+ polysilicon 481; and a second n+ polysilicon 482.

The signal storage node 430 is capped by an oxide layer 486. In a preferred embodiment, as shown in FIG. 6B, further isolation of the signal storage node 430 is provided by a nitride layer 488 upon the oxide layer 486.

The DRAM cell 400 may include a passing word line 490 formed above the signal storage node 430. Preferably, the passing word line 490 includes a layer of n+ polysilicon 492, a conductive layer 494, and a nitride layer 496. As known to those skilled in the art, the passing word line 490 may be used to couple the word lines 450 of other DRAM cells 400 on the substrate 405.

A planarized dielectric layer 498, preferably boron phosphorus doped silicon glass (BPSG), insulates the DRAM cell 400 from further manufacturing steps. In an exemplary embodiment, a barrier nitride layer 476 is deposited upon the substrate 405 before dielectric layer 498 is formed. The barrier nitride is used in the formation of the bit-line contact 410 which is borderless to the word line 450. In another exemplary embodiment, the signal storage node is a stacked capacitor.

Figure 7:
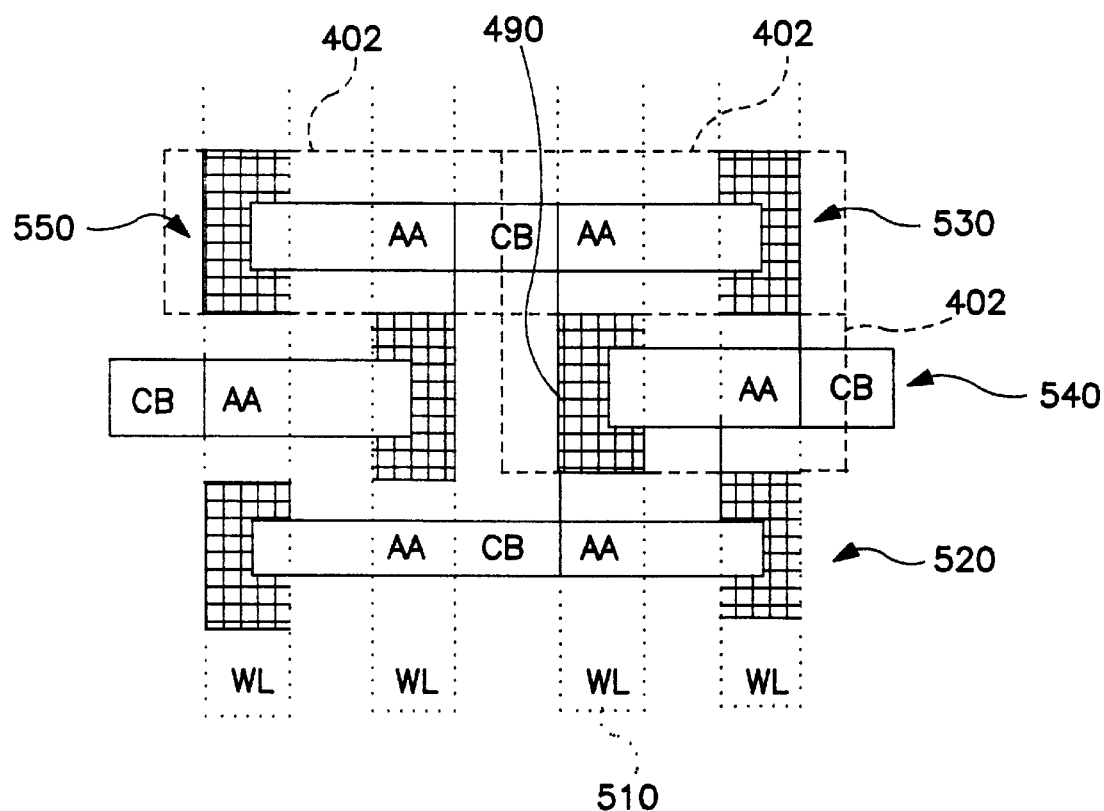
FIG. 7 shows a top view of an exemplary array of DRAM cells according to the present invention arranged on a substrate.

FIG. 7 shows a top view of an exemplary arrangement of DRAM cells 400 according to the present invention on a substrate 405. The word line 510 of a first DRAM cell 520 may be coupled to a second DRAM cell 530 using the passing word line 490 of a third DRAM cell 540. DRAM cell 530 and DRAM cell 550 share a bit-line contact and bit-line diffusion regions. Although the present invention is illustrated in a folded bit-line layout in the embodiment shown in FIGS. 5 and 7, the present invention is not limited to folded bit-line applications. For example, the present invention may also be applied to an open bit-line layout.

Process of Manufacture

A process of manufacturing a DRAM cell according to the present invention is described with reference to FIGS. 8A,B through 13A,B. Each of FIGS. 8A, 9A, 10A, 11A, 12A, and 13A correspond to cross sections taken along line 6A—6A of FIG. 5. Each of FIGS. 8B, 9B, 10B, 11B, 12B, and 13B correspond to cross sections taken along line 6B—6B of FIG. 5.

As shown in FIGS. 8A and 8B, an oxide layer 602 and a nitride layer 604 are formed upon the substrate 405. A signal storage node is then formed in the substrate 405. Preferably, a deep trench signal storage node 430 as shown in FIG. 8B is formed. The deep trench storage node 430 includes a buried $n^+$ plate 484, a signal storage node dielectric 485, a first $n^+$ polysilicon 481, a second $n^+$ polysilicon 482, and collar oxide 478, 480.

Processes for forming a deep trench signal storage node are described by Donald M. Kenney in U.S. Pat. No. 5,348,905 and by L. Nesbit et al., *A 0.6 $\mu m^2$ 256 Mb Trench DRAM Cell With Self-Aligned BuriEd STrap* (BEST), 1993 IEDM Technical Digest, 627–630 (1993), incorporated herein by reference.

In an exemplary embodiment, the deep trench signal storage node 430 is formed by etching a trench 610 into the substrate 405 through the oxide layer 602 and nitride layer 604. A layer of a doping source material such as arsenic doped glass (ASG) is formed upon the bottom of the trench 610 and upon the bottom portion of the sidewalls 606, 608 of the trench 610. The bottom portion of the sidewalls 606, 608 is the portion below the bottom of the collar oxide 478, 480.

The ASG may be formed on the bottom portion of the sidewalls 606, 608 and bottom of the trench 610 by first depositing the ASG on the sidewalls 606, 608 and bottom of the trench. Then a photoresist is deposited to fill the trench 610. The photoresist is etched down to the bottom portion of the trench 610 to expose the ASG on the upper portion of the sidewalls 606, 608 of the trench 610. The ASG on the upper portion of the sidewalls 606, 608 is then etched off.

A buried $n^+$ plate 484 is formed by out-diffusion of the diffusible element in the layer of doping source material into the substrate 405. The out-diffusion may be performed by annealing the doping source material and the substrate 405.

After removal of the doping source material, a signal storage node dielectric 485 is deposited upon the sidewalls 606, 608 and bottom of the trench 610. In an exemplary embodiment, the signal storage node dielectric 485 is formed by depositing a layer of silicon nitride upon the sidewalls 606, 608 and bottom (not shown) of the trench 610, and then oxidizing the silicon nitride layer surface. The trench 610 is then filled with a first $n^+$ polysilicon 481.

The first $n^+$ polysilicon 481 is recessed from the top of the trench 610 to a level as shown in FIG. 8B. The collar oxide 478, 480 is then formed on the sidewalls 608, 606 of the trench 610 above the level of the first $n^+$ polysilicon 481. The trench is then filled with a second $n^+$ polysilicon 482. The second $n^+$ polysilicon 482 is recessed and the exposed collar oxide 478, 480 is etched off the sidewalls 606, 608. The collar oxide 478, 480 is etched slightly below the level of the recessed second $n^+$ polysilicon 482 as shown in FIG. 9B.

The trench 610 is then filled with intrinsic (undoped) polysilicon 620 and then planarized, by chemical-mechanical polishing (CMP), for example. The intrinsic polysilicon 620 is recessed and an oxide layer 486 is formed upon the recessed intrinsic polysilicon 620. In an exemplary embodiment, a nitride layer 488 is then formed upon the oxide layer 486. The nitride layer 488 may be necessary to reduce the passing word line 490 to signal storage node 430 leakage if the integrity of the oxide layer 486 does not provide sufficient isolation.

As shown in FIGS. 10A and 10B, isolation regions 448, 449 are formed in the substrate 405. Preferably, the isolation regions 448, 449 are shallow trench isolation regions (STI).

The STI regions 448, 449 isolate the DRAM cell 400 from adjacent DRAM cells and define the mesa 437. STI regions 448 are formed in the substrate 405 adjacent the first side 442 of the mesa 437 and adjacent the second side 444 of the mesa 437. As shown in Fig. 10B, the STI region 449 extends down the sidewall 606 into the collar oxide 480. In an exemplary embodiment, the STI regions 448 are formed by etching trenches into the substrate 405 then filling the trenches by depositing an oxide by chemical vapor deposition (CVD), for example. In an exemplary embodiment, a thin oxide layer (not shown) is thermally grown in the trenches before depositing the oxide. In another exemplary embodiment, before depositing the oxide, a thin oxide layer (not shown) is thermally grown in the trenches and a thin layer of nitride (not shown) is deposited over the thin oxide layer to serve as a subsequent oxidation barrier.

As shown in FIG. 10A, the mesa width MW is the distance from the first side 442 to the second side 444 of the mesa 437. In a preferred embodiment, the mesa width MW is of a sub-lithographic dimension. A sub-lithographic mesa width MW may be formed by sub-lithographic techniques known to those skilled in the art such as phase-edge lithography or by a hybrid resist technique. The hybrid resist technique is taught by Hakey et al., Frequency Doubling Hybrid Photoresist, U.S. application Ser. No. 08/715,287, filed Sep. 16, 1996, incorporated herein by reference. In an exemplary embodiment, where F is the minimum lithographic dimension, the mesa width MW=0.5F. In an exemplary embodiment where the mesa width MW=0.5F and the STI regions 448 adjacent the mesa 437 have a width of F, the DRAM cell 400 has a width W=1.5F as shown in FIG. 10A.

The STI regions 448, 449 are planarized to the top surface of the nitride 604 as shown in FIGS. 10A and 10B. The nitride 604 is then stripped and the STI regions 448, 449 are etched. After etching, the top surface 452 of the STI regions 448 are a gate recess depth GRD below the top 446 of the mesa 437 as shown in FIGS. 11A and 11B. Preferably, the top surfaces 452 of the STI regions 448 are substantially planar. A planar top surface 452 of the isolation regions 448 may be achieved by forming the isolation regions 448 using a process including CVD (chemical vapor deposition) oxide deposition and chemical-mechanical polishing (CMP), for example. This also results in a device 400 exhibiting less stress than a device having non-planar isolation regions 448 formed using a LOCOS process.

In an exemplary embodiment, after STI region 448, 449 planarization and before the nitride 604 is stripped, the nitride 604 and the STI regions 448, 449 are implanted with germanium (Ge) or silicon (Si) as shown by arrows 616, for example, in FIGS. 10A and 10B. The implantation enhances the etch rate which improves control of the gate recess depth GRD. In an exemplary embodiment, the STI regions 448, 449 are etched using reactive ion etching (RIE) which propagates the planar top surface 452 downward. In another exemplary embodiment, the STI regions 448, 449 are etched using wet chemical etching with diluted or buffered HF (hydrofluoric acid), for example.

A sacrificial oxide (not shown) is then grown on the top 446 and sides 442, 444 of the mesa 437. A channel tailor implant is then made to tailor the threshold voltage $V_{th}$ of the transfer device 420. The channel tailor implant may be made at an angle as shown by arrows 614 in FIGS. 12A and 12B. The angle may be chosen to provide a desired dopant profile normal to the top 446 and side 442, 444 surfaces. As known to those skilled in the art, the angle of implantation may be chosen to reduce the loss of dopant due to scattering. In an exemplary embodiment, the channel tailor implant is made at an angle of 45° with respect to the first and second sides 442, 444 of the mesa 437.

Figure 12B:
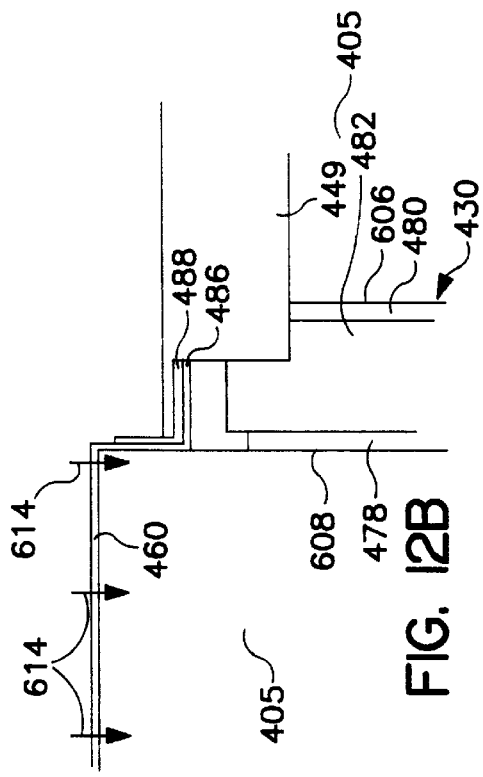
Figure 12A:
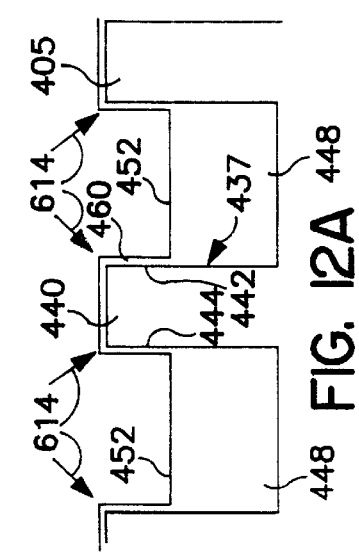

The sacrificial oxide is stripped and then the gate of the transfer device 420 is formed. As shown in FIGS. 12A and 12B, a dielectric layer 460 is formed upon the first and second sides 442, 444 and the top 446 of the channel 440. In an exemplary embodiment, the dielectric layer 460 is a deposited oxide layer. Depositing the dielectric layer 460 results in a DRAM device 460 having less stress, and a dielectric layer 400 of more uniform thickness, than a device having a thermally grown dielectric layer. Thermal oxide may also be used with proper orientation of the substrate 405 and with careful control of oxidation conditions.

In an exemplary embodiment, the wafer in which the device is formed is oriented so the first and second sides 442, 444 are in the <100>, <010>, or <001> planes. This increases the uniformity of oxidation rate on the first side 442, the second side 444, and top 446 of the mesa 437. A 45 degree rotation of the wafer about its normal axis may be required to achieve the desired crystal orientation if the flat of the wafer is in a <110> plane. If the flat of the wafer is in a <100> plane, rotation of the wafer may not be required.

Figure 13B:
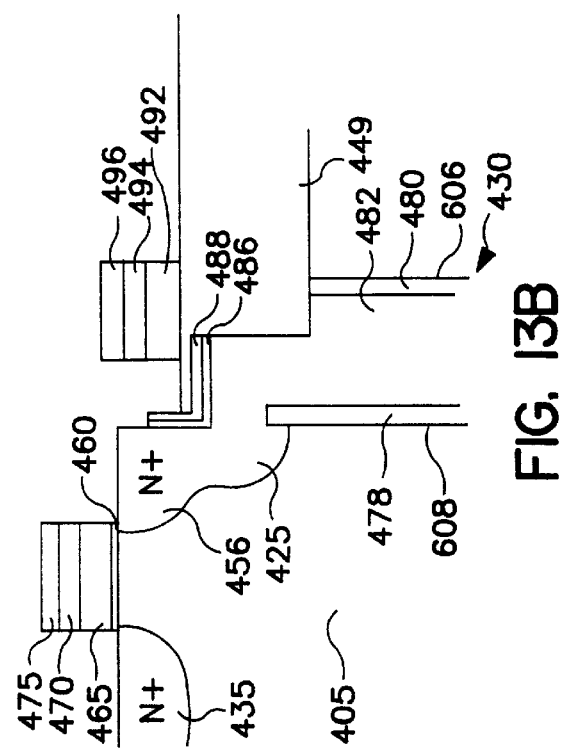
Figure 13A:
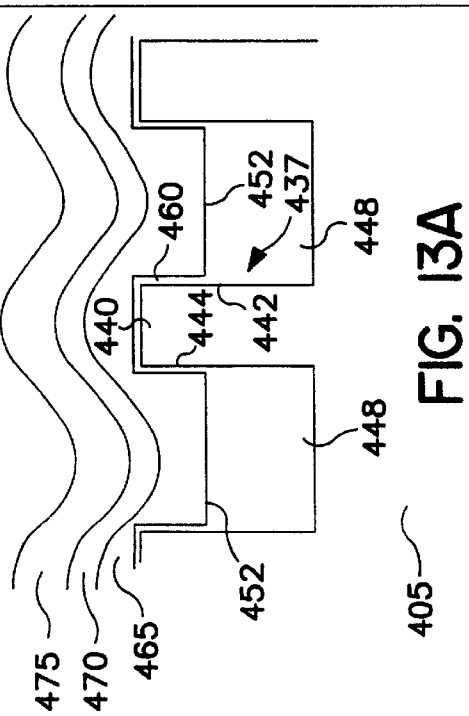

As shown in FIGS. 13A and 13B, conductors 465, 492 such as n$^+$ polysilicon or p$^+$ polysilicon; wiring conductors 470, 494 such as W or WSi$_x$; and nitride layers 475, 496 are deposited. The conductors 465, 492; wiring conductors 470, 494; and nitride layers 475, 496 are etched to form stacks for the word line 450 and the passing word line 490. In an exemplary embodiment, the sidewalls of the word line 450 and passing word line 490 stacks are then oxidized.

The buried strap 425, also known as a buried strap out-diffusion, is formed by out-diffusion of the n-type dopant impurity in the polysilicon 481, 482 of the signal storage node 430. The out-diffusion may be caused by high temperature processing steps. The high temperature processing steps may include isolation trench oxidation and anneals, sacrificial oxidation, gate oxidation, and junction anneals.

The substrate 405 is then implanted to form the storage node diffusion region 456 which connects to the buried strap 425 and to form the bit-line diffusion region 435. In an exemplary embodiment, a barrier nitride layer 476 is then deposited as shown in FIG. 6B.

A dielectric 498 is deposited and planarized as shown in FIGS. 6A and 6B. Preferably the dielectric 498 is boron phosphorus doped silicon glass (BPSG). A contact hole is etched through the dielectric 498 to the bit-line diffusion region 435. The contact hole is filled with a conductor such as n+ doped polysilicon, WSi$_x$, and/or W to form the bit-line contact 410. The bit-line contact 410 is then planarized and the bit-line metallization 415 is formed.

The process of manufacture described above allows the manufacture of a smaller DRAM cell without deteriorating the current drive capability or the shut off characteristics of the DRAM cell. The order of the process steps described above is exemplary and may be varied as known to those skilled in the art.

An exemplary embodiment of the present invention is described above using STI isolation regions 448, 449. If a polysilicon isolation region is allowed to float, energetic ion bombardment may cause process-induced charging of the isolation region. In addition, polysilicon isolation will be less effective for either n-channel field effect transistors (FETs) or p-channel FETs depending on the polarity to which the floating polysilicon charges. This problem may be avoided by using polysilicon isolation in the memory array portion of a chip which is tied to a fixed potential and using another isolation type such as STI or LOCOS for the support circuitry.

Figure 1:
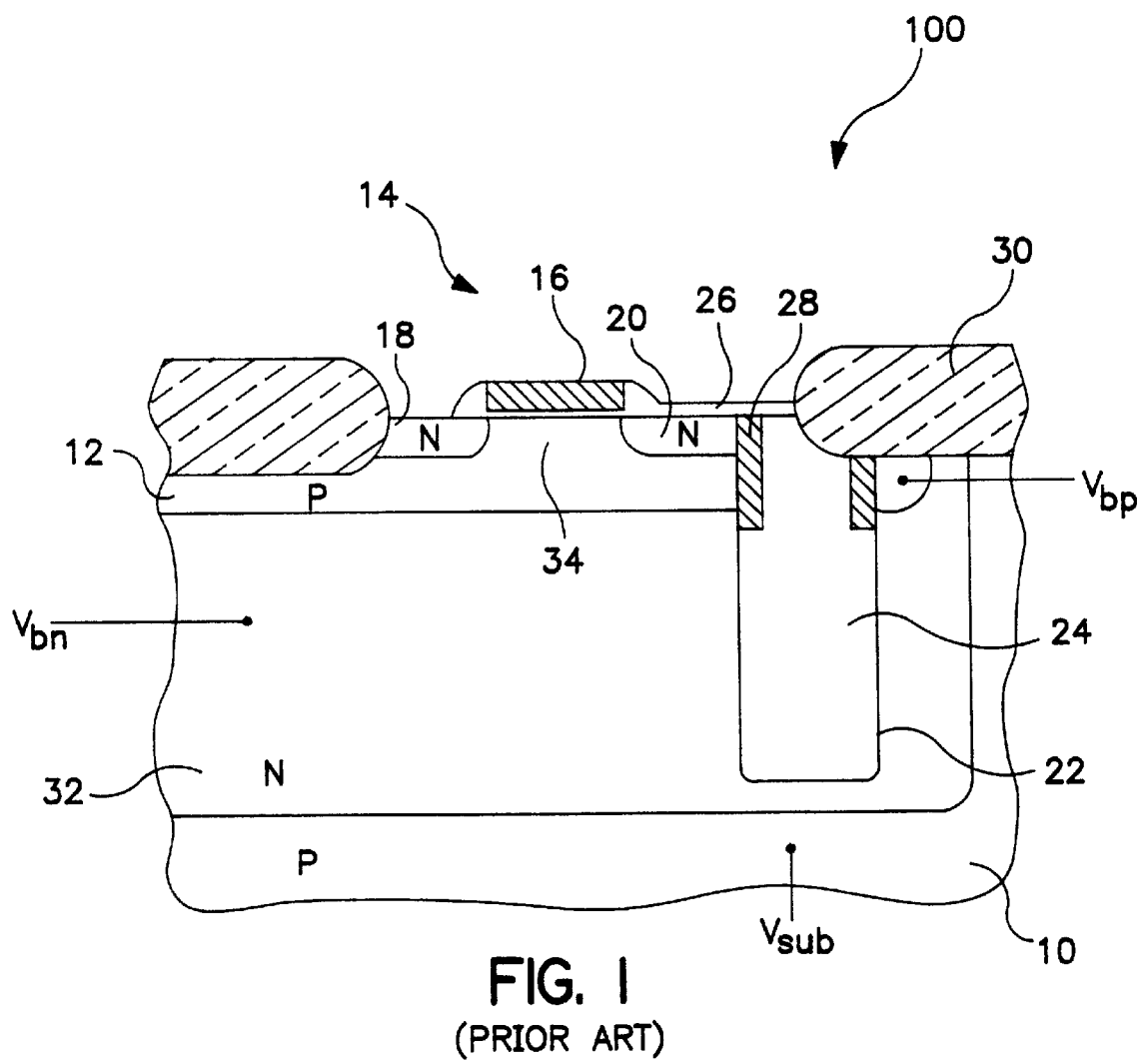
FIG. 1 is a cross section of a conventional diffused buried plate trench DRAM cell.
Figure 2A:
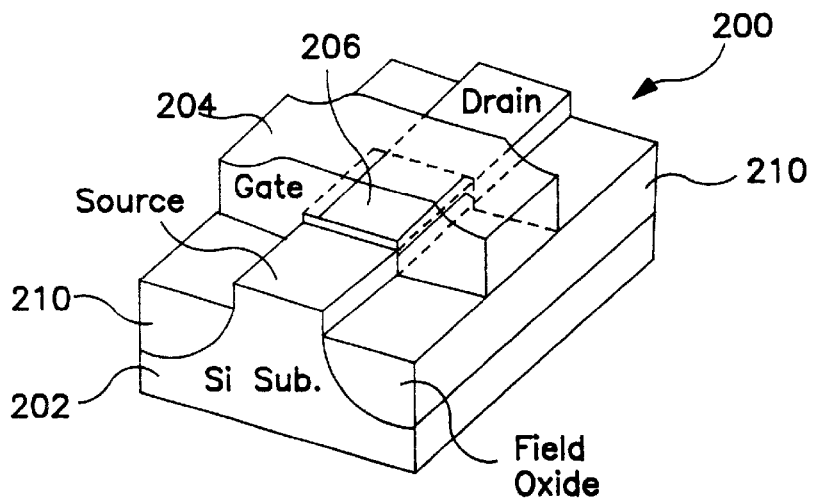
FIGS. 2A–2D illustrate a conventional three-sided gated DRAM cell in a diagonal bit-line configuration.
Figure 2B:
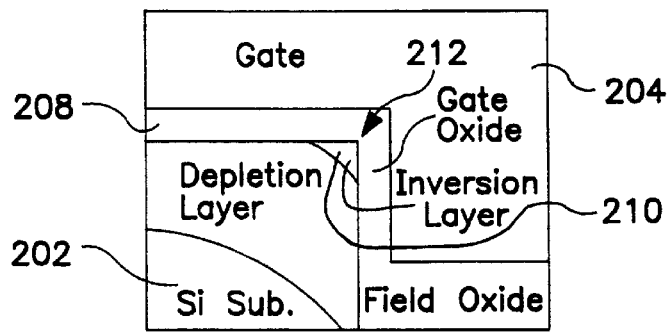
Figure 2C:
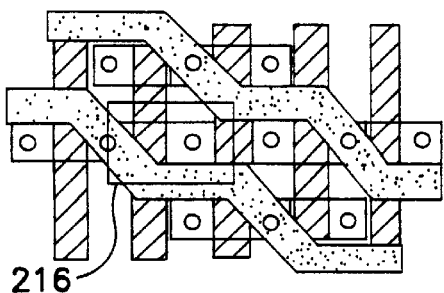
Figure 2D:
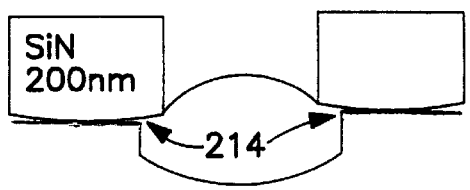
Figure 3:
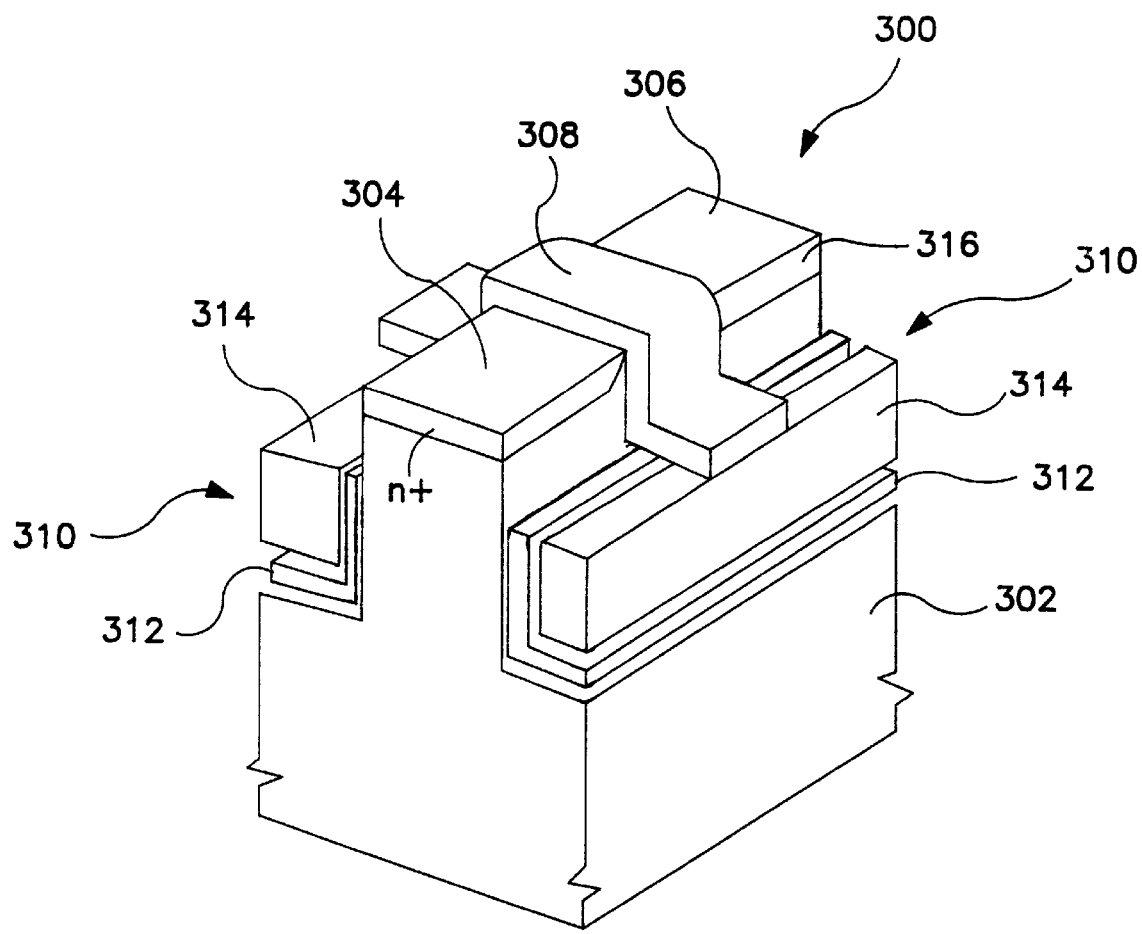
FIG. 3 illustrates a MOSFET device gated on three sides.

If the size of a DRAM cell 100 shown in FIG. 1 is scaled to reduce the surface area of substrate 10 occupied by the DRAM cell 100, the DRAM cell 100 performance may suffer. For example, as the width and length of the channel 34 are decreased to scale the DRAM cell 100, leakage current and charge time may increase due to a higher channel doping.

More specifically, as the dimensions of a DRAM cell 100 are reduced, channel 34 doping may need to be increased to suppress sub-threshold leakage. Gate oxide thickness may then need to be reduced to attempt to preserve electrical characteristics such as sub-threshold swing and back-bias sensitivity. Gate oxide thickness may not be reduced sufficiently, however, due to reliability considerations. Thus, conventional DRAM devices suffer from loss of gate control as dimensions are reduced.

The word line boost level of a DRAM device should be sufficiently high to allow rapid and efficient charge transfer from a bit-line to a storage node. The word-line boost level may be chosen a predetermined margin above the highest threshold voltage to account for variations in electrical operating conditions and processing tolerances.

Preferably, gate dielectric characteristics are chosen to withstand reliability degradation due to repeated application of the boosted word-line level which occurs during reading, writing, and refreshing of data stored in the storage capacitor. The word-line boost level and the maximum electric field across the gate dielectric may be used to determine the thickness of the gate dielectric.

As the size of a DRAM device is reduced, it may not be possible to scale down all device dimensions in equal proportion. The maximum threshold voltage of a DRAM device depends on its off-current requirement, sensitivity of the threshold voltage to variations in electrical operating conditions, and processing tolerances. Therefore, the maximum threshold voltage does not scale.

Since the minimum gate dielectric thickness is constrained by threshold voltage, gate dielectric thickness might not be scaleable in proportion to other parts of the device. Consequently, as a DRAM device is reduced in size while gate dielectric thickness is not proportionately scaled, device sensitivity to short and narrow channel effects may increase. Therefore, an exemplary design requirement of maintaining gate dielectric thickness to less than three percent (3%) of the channel length may not be possible as channel length is reduced below 0.15 $\mu$m due to consideration of the threshold voltage.

Because the gate dielectric proportionately becomes thicker as a device is reduced in size, threshold voltage sensitivity to processing tolerances and operating voltage variations increases. Channel doping may be increased as the threshold voltage variation increases to ensure that the lowest possible threshold voltage sufficiently turns off the device to prevent charge leakage from the storage node. The increase in channel doping results in increased junction leakage due to high-field effects in the presence of silicon defects, which reduces data retention time. Thus, a vicious cycle results in a planar DRAM device that is hypersensitive to processing tolerances and operating voltage variations.

Variations in channel length and width of a device, possibly due to processing tolerances, may result in threshold voltage variations. As gate dielectric thickness increases, variations in threshold voltage also increase due to an increase in sub-threshold swing and high substrate sensitivity, for example.

Figure 14:
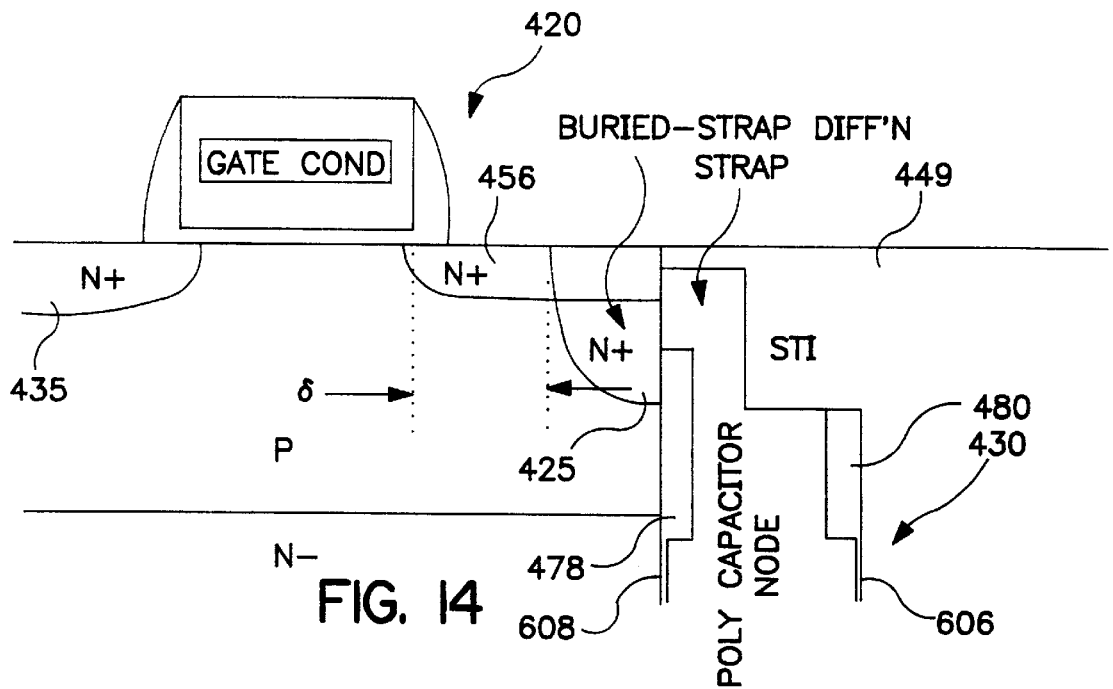
FIGS. 14 and 15 illustrate threshold voltage sensitivity of a device according to the present invention.

Deep trench storage nodes are sometimes used in DRAM devices since they facilitate device planarization which in turn facilitates lithography and etching processes. FIG. 14 shows a DRAM device with a deep trench storage node 430 coupled to a transfer device 420 using a buried strap 425 formed by a deep diffusion.

Buried strap diffusions are typically formed at a depth ranging from 0.20 $\mu$m to 0.25 $\mu$m. The distance between the buried strap diffusion and the gate edge is $\delta$. It is desirable to reduce the size of a DRAM cell to increase cell density on a chip. As the minimum lithographic dimension F used to manufacture a device decreases below 0.5 $\mu$m, for example, threshold voltage sensitivity to $\delta$ increases.

Figure 15:
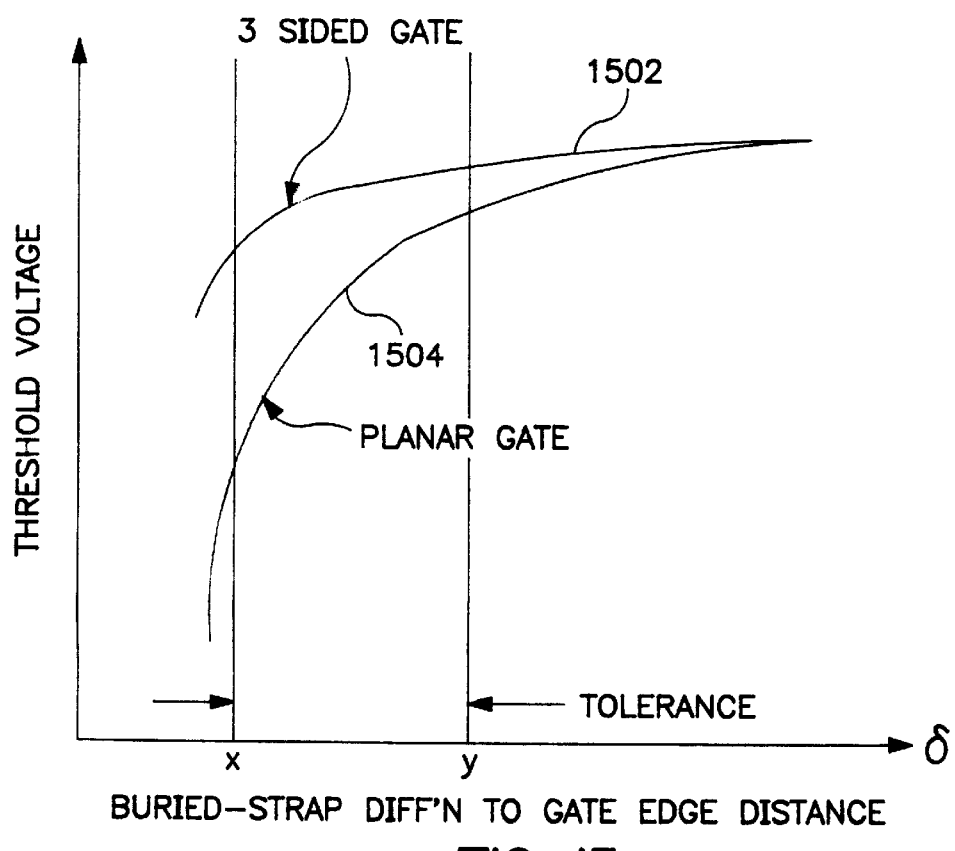

FIG. 15 illustrates the sensitivity of threshold voltage to $\delta$. Threshold voltage sensitivity for a device according to the present invention is modeled by curve 1502. Threshold voltage sensitivity for a device having a planar gate, such as device 100 in FIG. 1, is modeled by curve 1504. As the distance $\delta$ varies from x to y, threshold voltage sensitivity is reduced for a device according to the present invention relative to a device having a planar gate.

Figure 16:
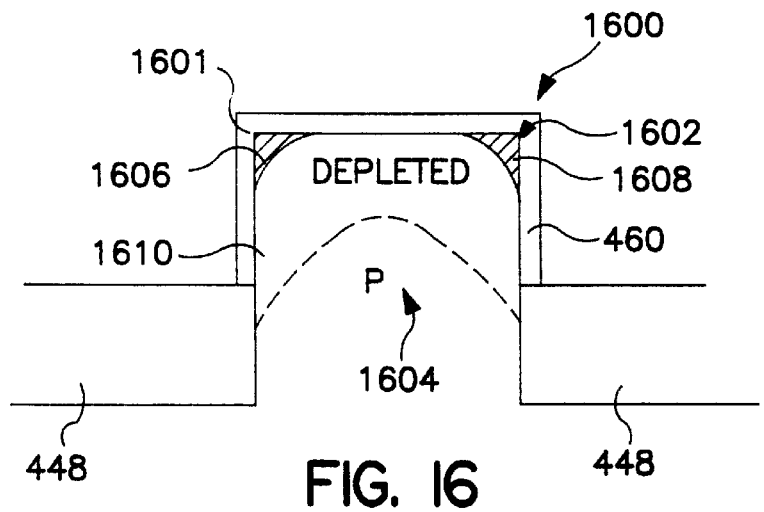
FIGS. 16 through 18 illustrate examples of the operation of a device according to the present invention.
Figure 17:
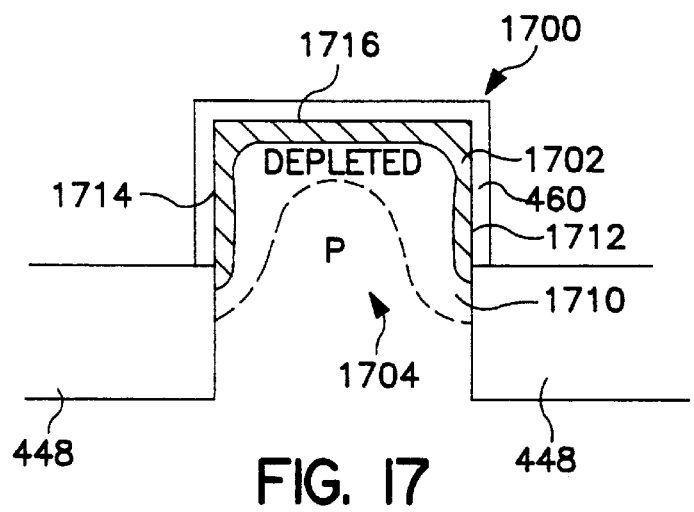
Figure 18:
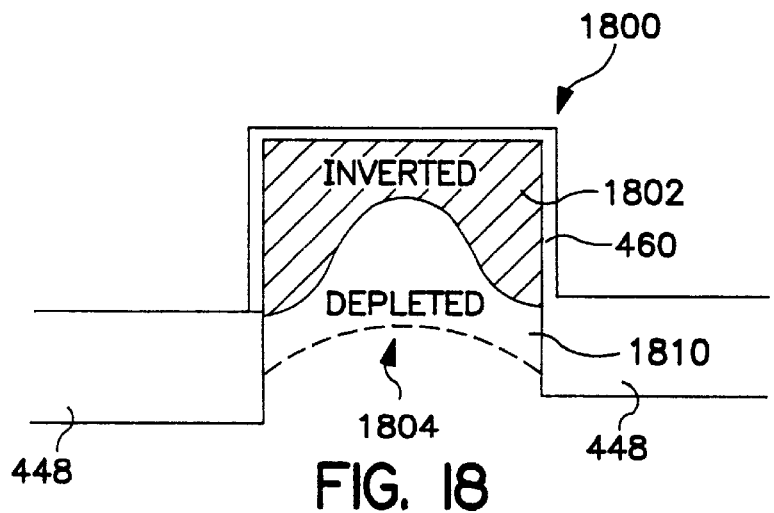

Operation of devices according to the present invention is described below with reference FIGS. 16 through 18. FIGS. 16 through 18 show partial cross sections of devices according to the present invention taken along line 6A—6A in FIG. 5. Table 1 below lists exemplary device manufacturing and operating parameters for achieving the operating characteristics illustrated in FIGS. 16 through 18. Devices 1600, 1700, and 1800 in FIGS. 16, 17, and 18, respectively, each include a gate dielectric 460 and isolation regions 448.

TABLE 1

| Figure | Gate Conductor | Mesa Doping | Mesa Width (MW) | Supply Voltage ($V_{GS}$) |
|---|---|---|---|---|
| FIG. 16 | n+ poly | 5–8 × $10^{17}$ cm$^{-3}$ | ≧F (F ≈ 0.20 $\mu$m) | ≧2.5 V |
| FIG. 17 | n+ poly | 1–3 × $10^{17}$ cm$^{-3}$ | ≧F (F ≈ 0.50 $\mu$m) | ≧3.0 V |
| FIG. 18 | n+ or p+ poly | 1 × $10^{15}$ cm$^{-3}$– 5 × $10^{16}$ cm$^{-3}$ | <F (F ≦ 0.15 $\mu$m) | ≦2.0 V |

As shown in FIG. 16, device 1600 may operate in a corner inversion mode with a depletion region 1610 and inversion layers 1606, 1608 formed in the corners 1601, 1602 of the mesa 1604. As shown in FIG. 17, device 1700 may operate in a surface inversion mode with a depletion region 1710 and an inversion layer 1702 formed along the sidewalls 1712, 1714 and the top 1716 of the mesa 1704.

As shown in FIG. 18, device 1800 may operate in a volume inversion mode with a depletion region 1810 and an inversion layer 1802 formed within the volume of the mesa 1804. The mesa width (MW) and the doping concentration of the mesa 1804 are made sufficiently narrow and low, respectively, to achieve full depletion in the silicon mesa 1804 at normal operating voltages which are less than or equal to the maximum voltage permitted for gate oxide reliability. This may result in the bulk depletion charge ($Q_B$) having a negligible contribution to the threshold voltage.

With an n+ polysilicon gate conductor and a small depletion charge ($Q_B$), the threshold voltage may be too low to meet the MOSFET off-current ($I_{OFF}$) requirement for a desired data retention time. Full depletion may be achieved while increasing the threshold voltage without increasing the doping concentration by using a p+ polysilicon gate conductor. Due to the work function difference between n+ and p+ polysilicon, the threshold voltage is raised by approximately 1.1V. This may increase the threshold voltage to an acceptable range while maintaining full depletion. In an exemplary embodiment, the threshold voltage ranges from 0.7 to 1.0 volts above the minimum value of $V_{GS}$ which is defined as the word line low-level minus the bit line low-level.

Figure 19:
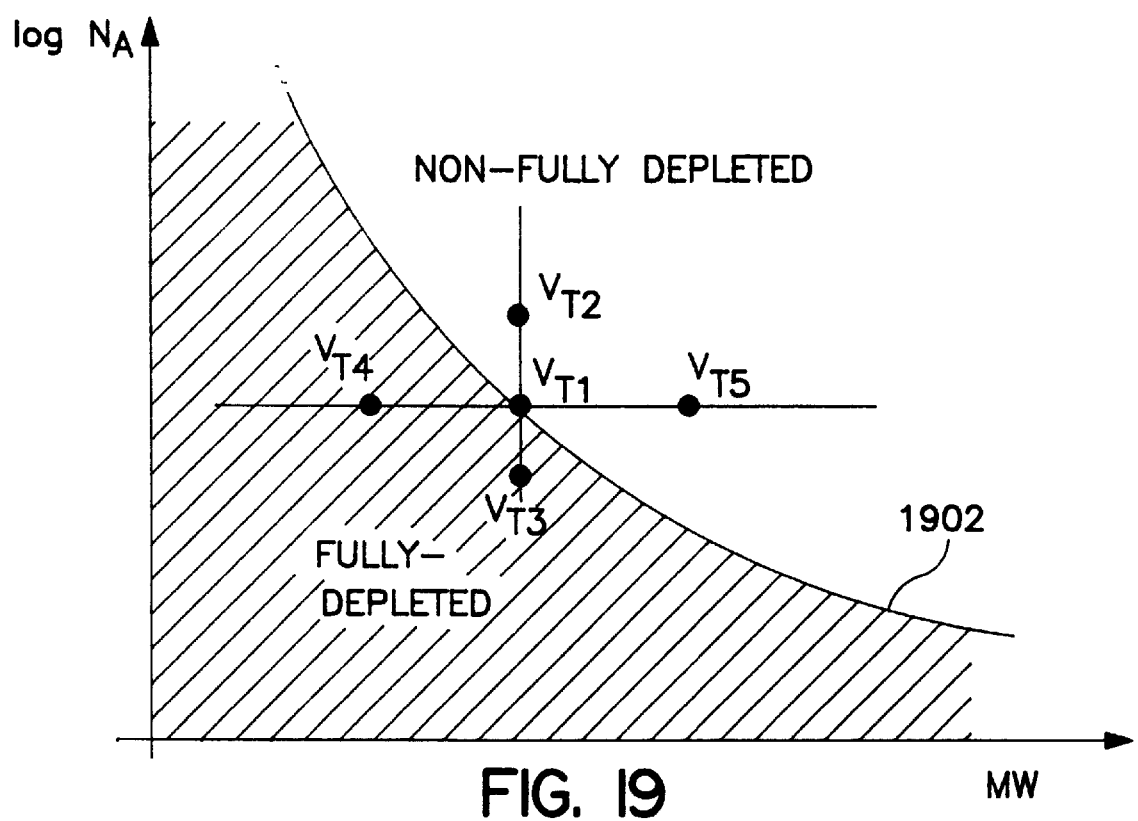
FIG. 19 is a graph showing a fully depleted boundary in relation to mesa doping concentration and mesa width.

The doping concentration of the mesa structure 437 is explained with reference to the log $N_A$-MW plane shown in FIG. 19. For a constant gate recess depth (GRD) and a constant mesa doping concentration, threshold voltage ($V_T$) increases with increasing mesa width ($V_{T5}>V_{T1}>V_{T4}$). For a constant gate recess depth (GRD) and a constant mesa width, $V_T$ increases with increasing doping concentration ($V_{T2}>V_{T1}>V_{T3}$). The locus of the fully depleted boundary 1902 is a function depending on factors including mesa doping, mesa width, gate recess depth, gate oxide thickness, and gate work function, for example. As known to those skilled in the art, the locus of the fully depleted boundary 1902 may be determined using a combination of 3-D device simulation and experimental data from an actual device.

The effective channel width of a device 400 according to the present invention is greater than MW+2GRD. The effective channel width is increased by two mechanisms. First, in addition to the top silicon surface 446, the sidewalls 442, 444 of the mesa 437 are gated. The current-carrying contribution from the sidewalls 442, 444 increases the effective channel width compared to a conventional device having only a gated top silicon surface. Second, a sub-minimum (<F) mesa width MW allows full depletion of majority charge carriers (holes in an n-channel metal oxide semiconductor field effect transistor) to be easily achieved. Full depletion results in "volume inversion" in the channel which means that inversion charge carriers (electrons in NMOSFET) are distributed throughout the volume of the channel rather than only on the gated surfaces of a channel as in conventional devices (see FIG. 18). The "volume inversion" increases the current-carrying capacity, or effective channel width, of a device according to the present invention. The current-carrying capacity may be characterized by the saturated current normalized to the "apparent width" (i.e., $I_{DSAT}/(MW+2GRD)$).

The gate conductor 470 of the present invention has increased control of the silicon electric potential due to the gating of three sides (sidewalls 442, 444 and top 446) of the mesa 437 of the device 400. This reduces the sub-threshold slope (mV/decade) and improves immunity to short channel effects and process variations.

The teachings of the present invention may be applied to DRAM cell types including SPT (substrate-plate-trench) cells, buried-plate SPT DRAM cells, and MINT (merged-isolation and node-in-trench) cells.

Although illustrated and described herein with reference to certain specific embodiments, the present invention is nevertheless not intended to be limited to the details shown. Rather, various modifications may be made in the details within the scope and range of equivalents of the claims and without departing from the spirit of the invention.

What is claimed is:

1. A process of manufacturing a dynamic random access memory device, comprising the steps of:
    (a) providing a substrate;
    (b) forming a signal storage node in the substrate;
    (c) forming a mesa structure in the substrate having a top, a first side, a second side opposite the first side, a first end, and a second end opposite the first end, wherein a distance from the first side to the second side is sub-lithographic;
    (d) forming a gate upon the top, the first side, and the second side of the mesa structure;
    (e) forming a bit-line diffusion region coupled to the first end of the mesa structure; and
    (f) forming a storage node diffusion region coupling the second end of the mesa structure to the signal storage node.

2. The process according to claim 1 wherein step (c) includes the steps of:
    (c1) etching a first trench into the substrate adjacent the first side of the mesa structure;
    (c2) etching a second trench into the substrate adjacent the second side of the mesa structure; and
    (c3) filling the first and second trenches with an oxide to a gate recessed depth below the top of the mesa structure.

3. The process according to claim 2 wherein step (c3) comprises:
    filling the first and second trenches with an oxide;
    implanting the oxide in the first and second trenches with one of germanium and silicon; and
    etching the oxide in the first and second trenches to the gate recessed depth below the top of the mesa structure.

4. The process according to claim 1 wherein step (d) includes the steps of:
    (d1) growing a sacrificial oxide layer upon the top, the first side, and the second side of the mesa structure;
    (d2) performing a channel tailor implant;
    (d3) removing the sacrificial oxide;
    (d4) forming a gate dielectric layer upon the top, the first side, and the second side of the mesa structure;
    (d5) depositing a conductor upon the gate dielectric layer; and
    (d6) depositing a nitride cap upon the conductor.

5. The process according to claim 4 wherein step (d4) comprises depositing a dielectric layer upon the top, the first side, and the second side of the mesa structure, wherein the dynamic random access memory device exhibits less mechanical stress than a device having a thermally grown gate oxide layer.

6. The process according to claim 4 wherein in step (d2) the channel tailor implant is performed at an angle with respect to the first side and the second side of the mesa structure.

7. The process according to claim 4 wherein step (d2) comprises doping the mesa structure to an impurity concentration to operate with conduction through the volume of the mesa structure.

8. The process according to claim 1 wherein step (b) comprises forming a deep trench type signal storage node.

9. The process according to claim 8 wherein step (b) includes the steps of:
    (b1) forming a deep trench having sidewalls and a bottom in the substrate;
    (b2) depositing a diffusible dopant layer containing a diffusible element on the bottom of the trench and on a bottom portion of the sidewalls of the trench;
    (b3) causing the diffusion of the diffusible element into the substrate;
    (b4) removing the diffusible dopant layer;
    (b5) depositing a dielectric layer on the sidewalls and bottom of the trench;
    (b6) filling the trench with a first conductor;
    (b7) etching the dielectric layer and the conductor from the trench down to a first level above the bottom portion of the trench;

(b8) forming a collar on the sidewalls of the trench above the first level;

(b9) filling the trench with a second conductor;

(b10) etching the second conductor and the collar down to a second level of the trench;

(b11) filling the trench with a third conductor;

(b12) etching the third conductor down to a third level of the trench; and (b13) depositing a dielectric layer upon the third conductor in the trench and upon the sidewalls of the trench above the third conductor.

10. The process according to claim 9 wherein step (b10) further includes etching the collar from the trench below the second level of the trench.

11. The process according to claim 9 wherein step (b5) of depositing a dielectric layer on the sidewalls and bottom of the trench comprises the steps of:

depositing a layer of silicon nitride on the sidewalls and bottom of the trench, the layer of silicon nitride having a surface; and oxidizing the surface of the silicon nitride layer.

12. The process according to claim 1 wherein step (c) comprises forming a substantially planar first side and a substantially planar second side.

13. The process according to claim 1 wherein step (c) comprises forming a shallow trench isolation region adjacent the first side and a shallow trench isolation region adjacent the second side.

14. The process according to claim 1 further comprising the step of doping the mesa structure wherein the device operates in a volume inversion mode.

15. The process according to claim 2 wherein the gate recess depth is greater than half a distance from the first side to the second side.

16. The process according to claim 4 wherein step (d4) comprises forming a substantially uniform thickness gate dielectric layer upon the top, upon the first side, and upon the second side of the mesa structure.

17. The process according to claim 4 wherein step (d5) comprises depositing a p+ polysilicon layer upon the gate dielectric layer.

* * * * *